US008189683B2

(12) United States Patent
Hu

(10) Patent No.: US 8,189,683 B2
(45) Date of Patent: May 29, 2012

(54) METHOD AND SYSTEM FOR PROVIDING SINGLE CYCLE CONTEXT WEIGHT UPDATE LEVERAGING CONTEXT ADDRESS LOOK AHEAD

(75) Inventor: Yendo Hu, La Jolla, CA (US)

(73) Assignee: General Instrument Corporation, Horsham, PA (US)

( * ) Notice: Subject to any disclaimer, the term of this patent is extended or adjusted under 35 U.S.C. 154(b) by 1330 days.

(21) Appl. No.: 11/564,076

(22) Filed: Nov. 28, 2006

(65) Prior Publication Data

US 2008/0122662 A1 May 29, 2008

(51) Int. Cl.
*H04N 7/12* (2006.01)
*G11B 21/08* (2006.01)

(52) U.S. Cl. .................... 375/240.26; 369/30.01

(58) Field of Classification Search ............ 375/240.26, 375/240.03, 240.28; 369/30.01; 382/239; 341/67; 712/228
See application file for complete search history.

(56) References Cited

U.S. PATENT DOCUMENTS

| 5,111,415 | A | | 5/1992 | Shackleford |
|---|---|---|---|---|
| 5,751,233 | A | | 5/1998 | Tateno et al. |
| 5,798,953 | A | | 8/1998 | Lozano |
| 5,951,677 | A | * | 9/1999 | Wolf et al. .................... 712/228 |
| 6,058,213 | A | * | 5/2000 | Cho .............................. 382/239 |
| 6,349,379 | B2 | | 2/2002 | Gibson et al. |
| 6,970,114 | B2 | | 11/2005 | Lovell |
| 7,286,066 | B1 | | 10/2007 | Ho et al. |
| 7,397,402 | B1 | | 7/2008 | Hu |
| 2003/0142874 | A1 | | 7/2003 | Schwartz |
| 2003/0189571 | A1 | | 10/2003 | MacInnis et al. |
| 2005/0012759 | A1 | | 1/2005 | Valmiki et al. |
| 2005/0066150 | A1 | | 3/2005 | Mehta |
| 2005/0259736 | A1 | | 11/2005 | Payson |
| 2006/0114985 | A1 | | 6/2006 | Linzer |
| 2006/0159181 | A1 | | 7/2006 | Park et al. |
| 2006/0256856 | A1 | * | 11/2006 | Koul et al. ............... 375/240.03 |
| 2006/0256869 | A1 | | 11/2006 | Chin |
| 2008/0111722 | A1 | * | 5/2008 | Reznik ........................... 341/67 |
| 2008/0137726 | A1 | | 6/2008 | Chatterjee et al. |
| 2008/0219349 | A1 | | 9/2008 | Huang et al. |
| 2008/0247459 | A1 | | 10/2008 | Hu |
| 2008/0276078 | A1 | | 11/2008 | Hu |
| 2011/0019737 | A1 | * | 1/2011 | Yang et al. ............... 375/240.03 |
| 2011/0200308 | A1 | | 8/2011 | Tu et al. |
| 2011/0280306 | A1 | | 11/2011 | Zheludkov et al. |

OTHER PUBLICATIONS

PCT International Search Report and Written Opinion for PCT/US07/83412. Dated May 15, 2008.

(Continued)

*Primary Examiner* — Gims Philippe
(74) *Attorney, Agent, or Firm* — Stewart M. Wiener

(57) ABSTRACT

A method stores, in a first memory location in a context weight update engine in an arithmetic encoder, a context weight value. The method also stores, in a second memory location in the context weight update engine in the arithmetic encoder, a context weight adjustment value. Further, the method reads, in a first clock cycle, the context weight value and a first binarization value from the first memory location. In addition, the method writes, in a second clock cycle, the context weight adjustment value and a second binarization value into the first memory location. The second binarization value is distinct from the first binarization value.

20 Claims, 8 Drawing Sheets

OTHER PUBLICATIONS

Roberto R. Osorio and Javier D. Bruguera, "Arithmetic Coding Architecture for H.264/AVC Cabac Compression System," in Proceedings of 2004 Euromicro Symposium on Digital Systems Design (DSD 2004), Architectures, Methods and Tools, Aug. 31-Sep. 3, 2004, Rennes, France. IEEE Computer Society 2004, pp. 62-69.

Florian Seitner, et al, "A Macroblock-level Analysis on the Dynamic Behaviour of an H.264 Decoder", IEEE ISCE 2007, Dallas, TX USA, Jun. 2007.

Schmookler, Martin S., Nowka, Kevin J., "Leading Zero Anticipation and Detection —A comparison of Methods". IEEE Proceedings, 15th Symposium on Computer Arithmetic (ARITH15) 2001.

ITU-T Recommendation H.264 (Mar. 2005), "Advanced video coding for generic audiovisual services", International Telecommunication Union, Mar. 2005.

Moffat, Alistair, Neal, Radford M., Witten, Ian H., "Arithmetic Coding Revisited", ACM Transactions on Information Systems, vol. 16, No. 3, Jul. 1998, pp. 256-294.

G. Sullivan, et al., ISO/IEC 14496-10 Advanced Video Coding 3rd Edition, ISO/IEC JTC 1/SC29/WG11, N6540, Redmond (USA), Jul. 2004.

* cited by examiner

METHOD AND SYSTEM FOR PROVIDING SINGLE CYCLE CONTEXT WEIGHT UPDATE LEVERAGING CONTEXT ADDRESS LOOK AHEAD

BACKGROUND

1. Field

This disclosure generally relates to the field of video data processing. More particularly, the disclosure relates to Context Adaptive Binary Arithmetic Coding ("CABAC") for digital video encoders.

2. General Background

Video signals generally include data corresponding to one or more video frames. Each video frame is composed of an array of picture elements, which are called pixels. A typical color video frame having a standard resolution may be composed of over several hundreds of thousands of pixels, which are arranged in arrays of blocks. Each pixel is characterized by pixel data indicative of a hue (predominant color), saturation (color intensity), and luminance (color brightness). The hue and saturation characteristics may be referred to as the chrominance. Accordingly, the pixel data includes chrominance and luminance. Therefore, the pixel data may be represented by groups of four luminance pixel blocks and two chrominance pixel blocks. These groups are called macroblocks ("MBs"). As a video frame generally includes many pixels, the video frame also includes a large number of MBs. Thus, digital signals representing a sequence of video frame data, which usually include many video frames, have a large number of bits. However, the available storage space and bandwidth for transmitting these digital signals is limited. Therefore, compression processes are used to more efficiently transmit or store video data.

Compression of digital video signals for transmission or for storage has become widely practiced in a variety of contexts. For example, multimedia environments for video conferencing, video games, Internet image transmissions, digital TV, and the like utilize compression. Coding and decoding are accomplished with coding processors. Examples of such coding processors include general computers, special hardware, multimedia boards, or other suitable processing devices. Further, the coding processors may utilize one of a variety of coding techniques, such as variable length coding ("VLC"), fixed coding, Huffman coding, blocks of symbols coding, and arithmetic coding. An example of arithmetic is Context Adaptive Binary Arithmetic Coding ("CABAC").

CABAC techniques are capable of losslessly compressing syntax elements in a video stream using the probabilities of syntax elements in a given context. The CABAC process will take in syntax elements representing all elements within a macroblock. Further, the CABAC process constructs a compress bit sequence by building out the following structure: the sequential set of fields for the macroblock based on the chosen macroblock configuration, the specific syntax element type and value for each of the fields within this field sequence, and the context address for each of the syntax elements. The CABAC process will then perform binarization of the syntax elements, update the context weights, arithmetically encode the binarizations of syntax elements ("bins"), and subsequently pack the bits into bytes through the syntax element processing component.

The components of the CABAC process include: the CABAC weight initialization mode selection module, the macroblock syntax sequence generator, the binarization engine, the context address generator, the context weight update engine, the arithmetic coder, the bit packetizer, and the Network Abstraction Layer ("NAL") header generator. The CABAC engine within a video encoder may accomplish two goals within the encoding process: (1) to carry out compressed data resource prediction for mode decision purposes; and (2) to losslessly compress the data for signal output delivery. The compressed data resource prediction task predicts the amount of bits required given a set of specific encoding modes for a given macroblock. Potential mode decision implementations may have up to eight modes to select from. The computational demand on the CABAC engine to support the mode decision task is significant.

The weight update, arithmetic encoder and the bit packing components of the CABAC engine may require a significant amount of non-trivial computational and processing resources in a sequential processor implementation. Given the fact that high performance encoding systems will require multiple macro block rate distortion iterations of encoding per macro block, the CABAC process may impose an unreasonable resource demand on a processor-based solution. Prior implementations typically compromise on mode decision CABAC resource estimation accuracy by limiting the CABAC to bin level accuracy.

Previous work focusing on optimizing the adaptive weight update engine in CABAC implementations has been relatively limited. A hardware solution for optimizing the adaptive weight update engine in CABAC implementations has been proposed for an Arithmetic Coding Architecture for H.264/AVC CABAC Compression Systems using only single port memory modules. To attempt to achieve near single cycle operation, this solution requires the removal of most of the input data set types and requires an alternative engine that may process the removed data types. By selectively choosing only some input data types, this solution ensures that no single weight will be accessed within a minimum number of clock cycles. The implementation requires enough cycles to read, update, and write the data back into the single port memory.

SUMMARY

In one aspect of the disclosure, a method is provided. The method stores, in a first memory location, a current context weight value. Further, the method stores, in a second memory location, a context weight adjustment value. In addition, the method reads, in a first clock cycle, the current context weight value from the first memory location. Finally, the method writes, in a second clock cycle, the context weight adjustment value into the first memory location.

In another aspect of the disclosure, a method is provided. The method stores, in a first memory location, a current context weight value for a context weight arithmetic encoder. Further, the method stores, in a second memory location, a context weight adjustment value for the context weight arithmetic encoder. In addition, the method reads, in a first cycle, the current context weight value from the first memory location. The method also writes, in a second cycle, the context weight adjustment value into the first memory location. Finally, the method adjusts a coded range value based on the current context weight value.

In yet another aspect of the disclosure, a method is provided. The method stores, in a first memory location, a current context weight value for a context weight arithmetic encoder. Further, the method stores, in a second memory location, a context weight adjustment value for the context weight arithmetic encoder. The context weight adjustment value is determined from a zero value detector that receives the current context weight value as an input. In addition, the method reads, in a first cycle, the current context weight value from the first memory location. The method also writes, in a second cycle, the context weight adjustment value into the first memory location. Further, the method adjusts a code range value based on the current context weight value. Finally, the method updates a code low value based on the code range value.

BRIEF DESCRIPTION OF THE DRAWINGS

The above-mentioned features of the present disclosure will become more apparent with reference to the following description taken in conjunction with the accompanying drawings wherein like reference numerals denote like elements and in which.

DETAILED DESCRIPTION

A method and system are disclosed, which provide an improved video digital data compression capable of providing a single cycle context weight update leveraging context address look ahead for real-time digital video encoders, such as an MPEG-4 or an H-264 series encoder. A dual port memory and advanced look-ahead engines may be utilized so that filtering of the input data set is not needed. In other words, all context types may be processed on every clock cycle without any constraint on the order and the frequency of the input data sets. In one embodiment, a CABAC context weight update process is provided to achieve a single cycle weight update implementation in a hardware environment. The single cycle weight update implementation resolves potential pipeline bottleneck issues by achieving twice the overall CABAC processing throughput using less than five percent of additional gate level resources. In another embodiment, the CABAC context weight update process is provided to achieve updating of the context weight on every other cycle through the combined use of a single port memory and a dual port memory.

Accordingly, the CABAC engine within a video encoder carries out compressed data resource prediction and delivers the actual compressed data sequence. The compressed data resource prediction predicts the amount of bits required given a set of specific mode decisions for a given macroblock.

Figure 1:
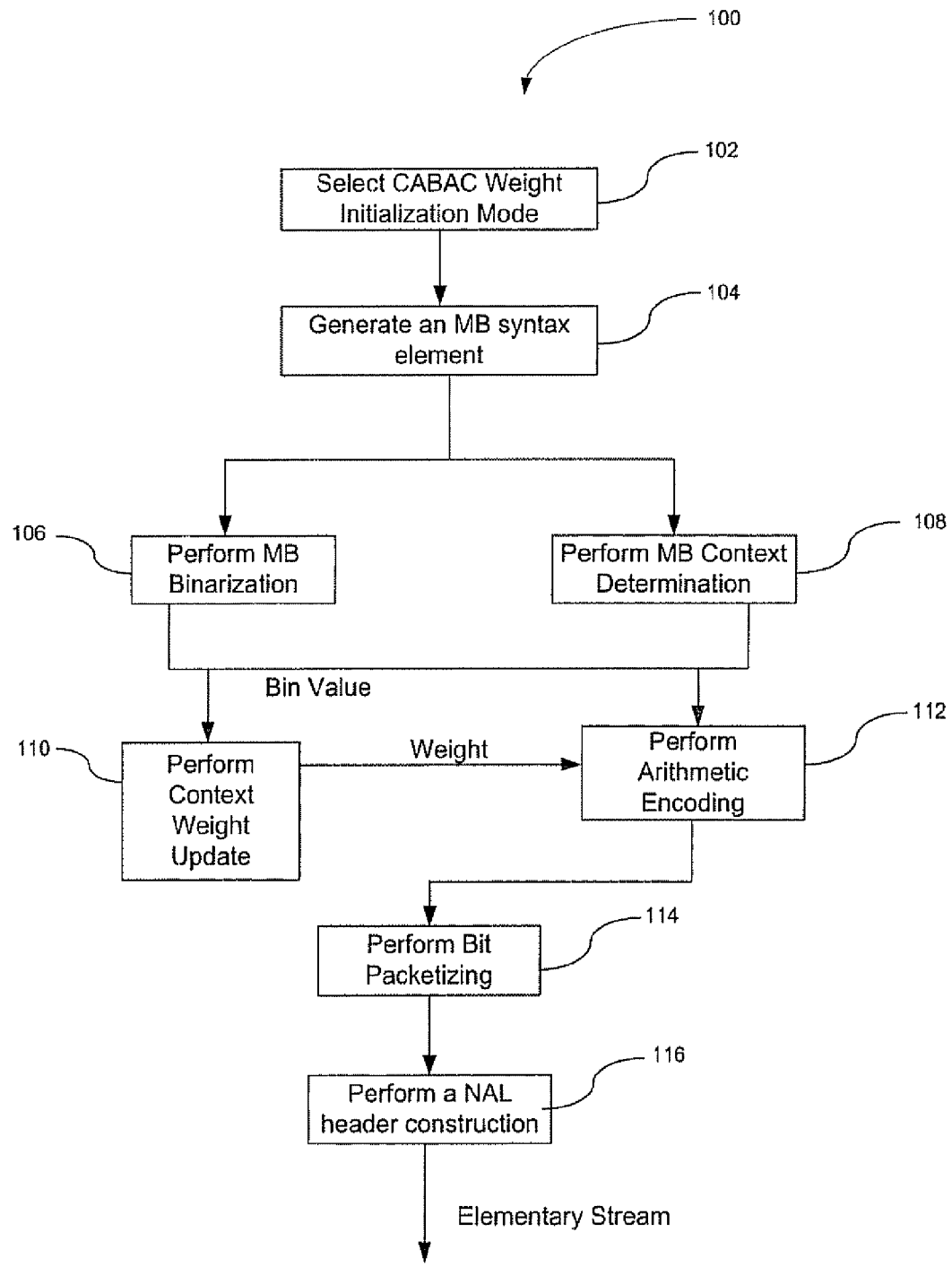
FIG. 1 illustrates a CABAC process.

FIG. 1 illustrates a CABAC process 100. At a process block 102, the CABAC process 100 selects a CABAC weight initialization mode. Further, at a process block 104, the CABAC process 100 generates an MB syntax sequence. In addition, at a process block 106, the CABAC process 106 converts a syntax to binary. The term binarization may be utilized to denote the process block 106. Further, at a process block 108, the CABAC process 100 performs a context address determination. The term ctxIdx generation may be utilized to denote the process block 108. At a process block 110, the CABAC process 100 performs a context weight update. Further, at a process block 112, the CABAC process 100 performs an arithmetic encoding. In addition, at a process block 114, the CABAC process 100 performs a bit packetizing. Finally, at a process block 116, the CABAC process 100 performs a NAL header construction. An elementary stream results from the CABAC process 100.

Figure 2:
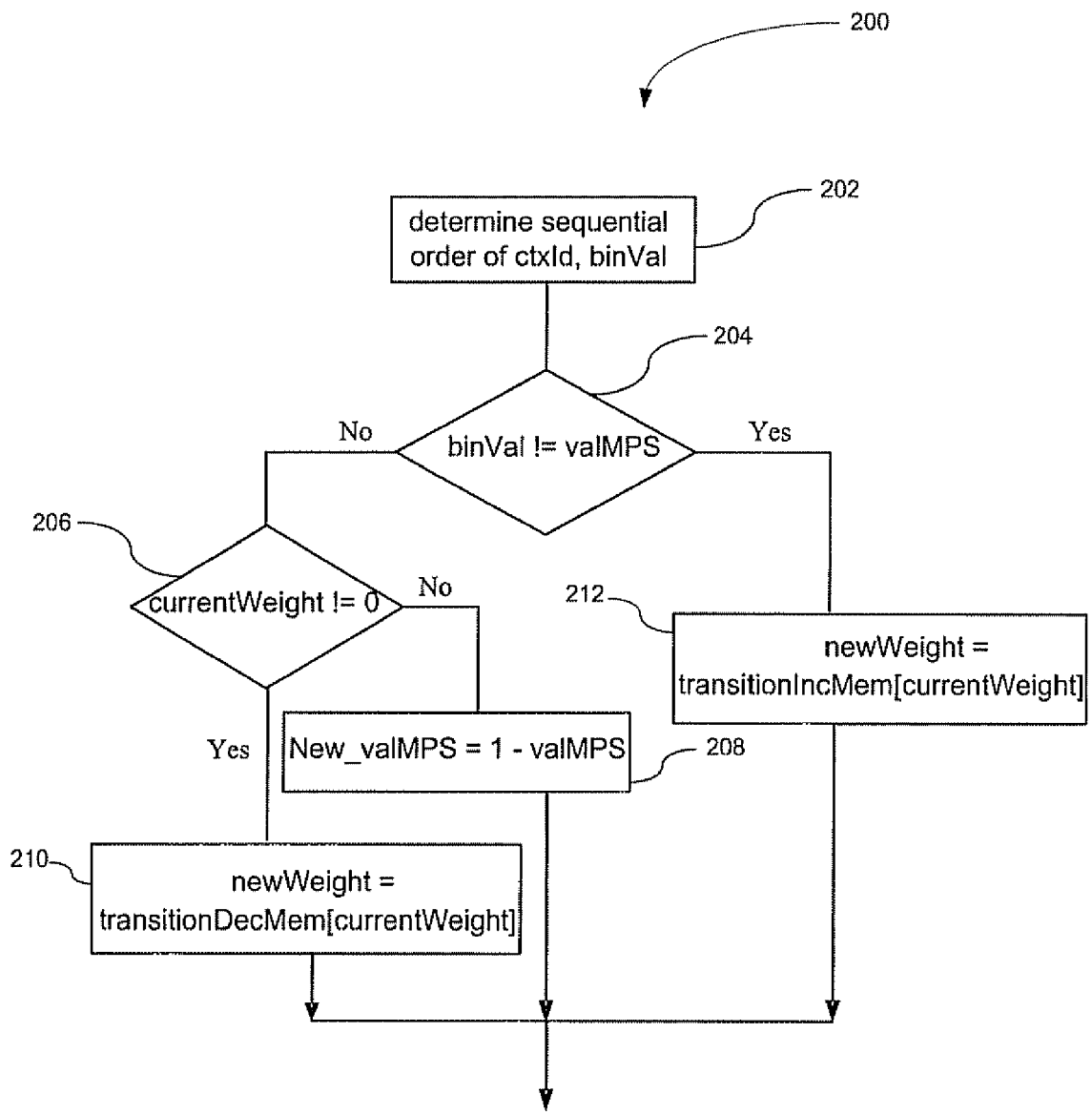
FIG. 2 illustrates a context weight update engine process.

FIG. 2 illustrates a context weight update engine process 200. At a process block 202, the sequential order of the update of the context weight based on an input context address id ("ctxId") and bin value ("binVal") is determined. At a decisions block 204, the input binVal is compared to the associated internally predicted bin value ("VALMPS") pointed to by ctxId from the process block 202. In the event that the binVal is successfully predicted, the weight associated with the ctxId is incremented non-linearly based on the current weight value at a process block 212. In the event that the VALMPS failed to correctly predict the binVal, at a decision block 206, the context weight update engine process 200 determines if the current weight is or is not zero. If the current weight is not zero, the weight associated with the context ctxId is decremented non-linearly at the process block 208 based on the current weight value, where the non-linear function is represented by a lookup table. In the event that the context weight update engine process 200 determines that the current weight is zero and the VALMPS failed to predict the current binVal, the VALMPS is at a process block 210 without updating the associated weight. The contents of MPEG4 Video Part 10 Standard: ISO/IEC JTC 1/SC 29/WG 11 N6540 are hereby incorporated by reference with respect to context weight update.

In one embodiment, a hardware solution is capable of providing dynamic context weight update and arithmetic coding. This approach provides significant modifications over prior approaches to remove non-deterministic performance and to reduce practical implementation concerns. Specifically, in one aspect, the present implementation is capable of achieving a single cycle per symbol implementation without context management optimization.

Context Weight Update Engine

In one embodiment, the context weight update engine (or module) supports two memory blocks, one to hold a current weight and another to hold a weight adjustment value. The context weight update engine takes one cycle to read the current context weight, which is then used by the rest of the modules. The second cycle writes the adjusted data back into the memory block. The internal memory block supports simultaneous read/write capability. Thus, the write back cycle includes the read for the next bin. This implementation will function correctly under repeated back-to-back access of the same context weight. This is achieved by configuring the internal memory block with write through capability. This hardware implementation may be achieved in either a single cycle or two cycle structure as will be described in detail hereinbelow.

Two Cycle State Machine Implementation

Figure 3:
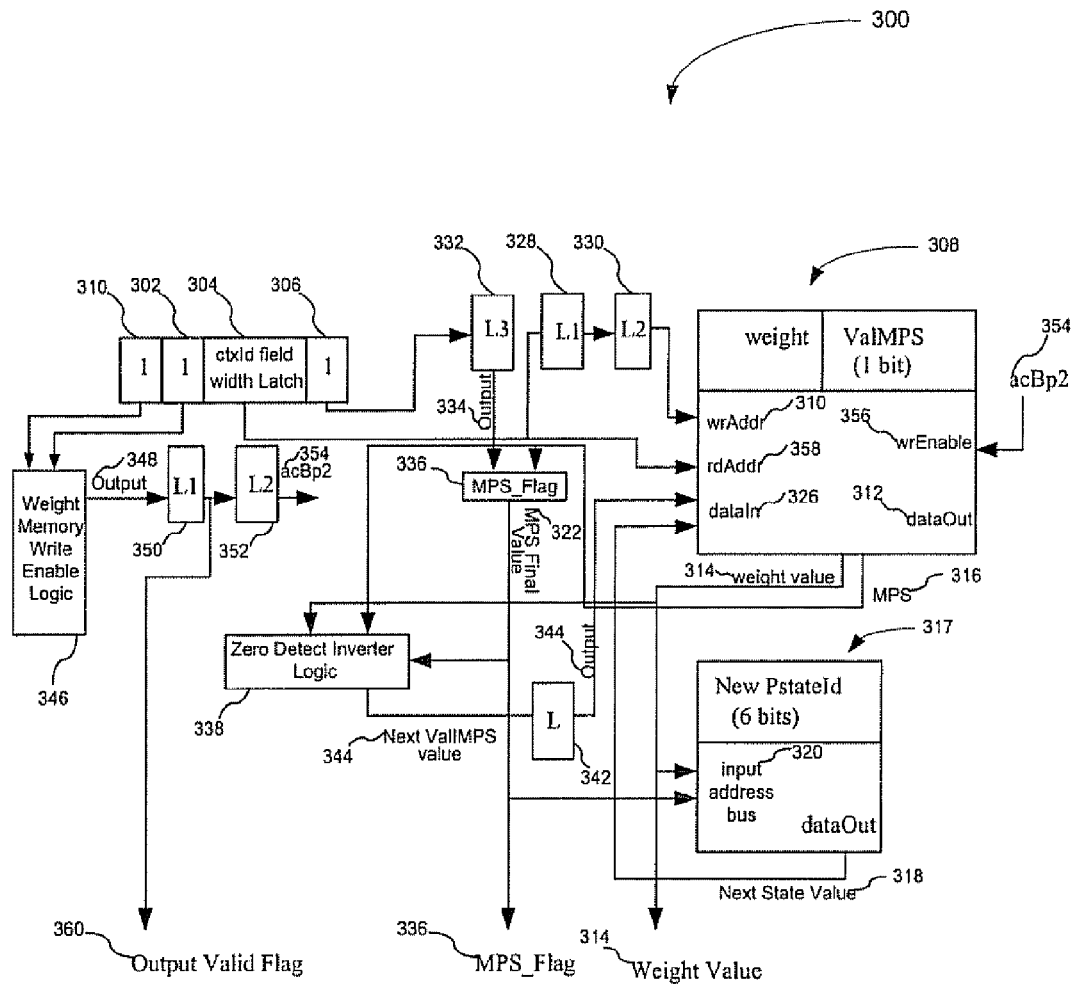
FIG. 3 illustrates a context weight update engine that is implemented as a two cycle context weight update engine.

FIG. 3 illustrates a context weight update engine 300 that is implemented as a two cycle context weight update engine. The context weight update engine 300 includes three data inputs: acBypass 302, ctxId 304, and binVal 306.

The acBypass 302 input is a single bit flag that identifies if an adaptive weight, which is located in memory 308, will be used to determine the output value. A value of one for the acBypass 302 indicates that no adaptive weights will be used to determine the output value. A value of zero for the acBypass 302 indicates that the output will not depend on the adaptive weights, but instead, rely on a predefined constant weight value to determine the output.

The ctxld 304 input is a bit field that provides the address of the weight location in memory 204 to be used to determine the output. For example, the ctxld 308 may comprise a 9 bit field. This weight which is pointed by the address is also updated based on the value of the binVal 306 flag.

The binVal 306 input is a single bit binary field that gives the value to be encoded into the output bit stream. This bit is represented in the output string based on a function that uses the weight located in the memory 308 with an address for ctxld 304.

The context weight update engine 300 may include an additional input, Valid 310, The Valid is a single bit binary field that gives the validity of all the other input fields, e.g., acBypass 302, ctxld 304, and binVal 306. The Valid field 310 must transition to low in the next clock cycle immediately after a high state to ensure that there exists a non-valid input after each valid input. This is necessary to address the need for two data processing cycles for each input data set, such as acBypass 302, ctxld 304, and binVal 306.

On every other clock cycle, a new set of input data is clocked into the context weight update engine 300 such that the context weight update engine 300 will process a new set of input data, consisting of acBypass 302, ctxld 304, and binVal 306, on each clock cycle. In one embodiment, the context weight update engine 300 processes the inputs acBypass 302, ctxld 304, and binVal 306 through four parallel threads.

In a first thread, a new set of input data acBypass 302, ctxld 304, and binVal 306 is provided at clock 0. The ctxld 304 is latched into the input address 310 of the weight memory 308 on the first clock cycle. Between the first clock latching edge and the second clock latching edge, the corresponding six bit weight value is available on the output 312 of the weight memory 308. Along with the weight value 314, a most likely bin value 316, labeled as most probable symbol ("MPS"), is also produced at the output of the weight memory 308. This MPS value 316 is also produced between the first and the second clock's latching edge. On the second clock latch edge, the state transition memory 317 will latch the weight value 314 on an input address bus 320. The state transition memory 317 will also latch the MPS final value 322, which is delivered from the second thread, as will be described below. The combination of the weight output 314 and the MPS final value 316 constitutes the address input for the state transition memory 317. The state transition memory 317, also referred to as the state transition table, will output the next state value 324 from the state transition memory 317 between the second and third clock latch edge. The output 324 is then fed back to a data interface 326 of the weight memory 308. This data in the output 324 is then latched on the third clock latch edge into the weight memory 308, thereby completing the update of the weight within the weight memory 308.

In a second thread, the ctxld 304 input is delayed by two clock cycles through two latches: a first latch 328 and a second latch 330. The ctxld 304 input serves as the write address 310 into the weight memory 308 on the third clock latch edge. This corresponds to the data output of the next state value 318 from the state transition memory 208.

In a third thread, the binVal 306 bit field is delayed by one clock cycle through the third delay latch 332. The output 334 of the one cycle delayed binVal 306 is logically "AND" with the output from the weight memory 308 generated through the first thread, as described above. The output of the "AND" logic, labeled as MPS_Flag 336, is active if the weight memory 308 correctly predicted the binVal 306. The MPS_flag 336, which stabilizes between the first clock and the second clock latch edges, is then fed into the zero detect inverter logic 338, along with the weight output 314 from the weight memory 308 and the MPS final bit value 316 from the weight memory 308. The zero detect inverter logic 338, which flips the MPS final bit value 316 if the context weight update engine 300 did not correctly predict the binVal 306, which is reflected by having the MPS_Flag 336 equal to zero, and the weight value 314 after the first clock latch edge is equal to zero. The zero detect inverter logic 338 outputs the next VALMPS value 340 between the first and the second clock latch edges. This next VALMPS value 340 is delayed through a VALMPS delay latch 342, where the output 344 of the ValMPS delay latch 342 is then fed back to the weight memory 308 as a data input for storage on the third clock latch edge. This completes the update and storage of the MPS for the ctxld 304 latched on the $0^{th}$ clock.

In a fourth thread, the acBypass bit field 302 is inverted and logically "AND" with the valid input bit field 310 by weight memory write enable generation logic 346. The output 348, from the weight memory write enable generation logic 346, is delayed by two clock cycles through a first delay latch 350 and a second delay latch 352. The two clock cycle delayed weight write enable 354 is then fed into the write enable input 356 to the weight memory 308. Thus, in the event when acBypass 302 is enabled or the input valid field is not valid, the weight memory 308 will not be updated.

In one embodiment, the context weight update engine 300 as described herein includes a number of processing components. The weight memory 308 may be a synchronous dual port memory that supports two memory access interfaces: a read interface and a write interface. The read interface will output through a dedicated output bus the content that is addressed by the latched input address from a dedicated input address interface. The output will become available after the input address clock latch edge, but before the next clock latch edge. The output of this dual port memory is unregistered. The write interface will write the latched data from a dedicated input interface into memory following the address latched on the write address interface. The context weight update engine 300 may support the same clock that clocks both the input and the output latches. In the event that the write address 310 is the same as read address 358, the read data output will reflect the current latched write data input. The context weight update engine 300 may support a write enable input 356, where a write into memory will occur only if the write enable input is high at the time the input address and data are latched.

The context weight update engine 300 further includes the state transition memory 317, which is a single port ROM memory that stores the next weight value based on the current weight value and the MPS_Flag result. The state transition memory 317 outputs the content addressed by the latched input address 320 to a dedicated output interface 318. The output will become available after the input address clock latch edge, but before the next clock latch edge. The output of this ROM single port memory 318 is unregistered.

The zero detect inverter logic 338 in the context weight update engine 300 receives the weight value 314, a VALMPS bit, which gives the most probable bin value for this weight address, and the MPS_Flag 336, which is active if the VALMPS bit correctly predicted the binVal for the current input. The zero detect inverter 338 will invert VALMPS if the current weight value is zero and the MPS_Flag signals a miss on the prediction. In one embodiment, the zero detect inverter logic 338 includes combinatorial logic without any internal latches.

The MPS_Flag logic 336 of the context weight update engine 300 outputs a bit. If the weight memory 308 successfully predicted the corresponding binVal 306, then the output is high, where the output is low if the weight memory 308 was not successful in predicting the corresponding binVal 306. In one embodiment, the MPS_Flag logic 336 includes a single excluding OR gate without any latches.

The weight memory write enable generation logic 346 generates the write enable signal 348 for the weight memory 308. This weight memory write enable logic 346 may include an AND gate and a NOT gate. The weight memory write enable logic 346 receives the acBypass 302 and the Valid 310 field from the inputs and will generate an active high output if the Valid 310 field is high and the acBypass 302 is low.

The context weight update engine 300 utilizes a plurality of delay latches. In one embodiment, the context weight update engine 300 includes six single cycle delay latches, e.g., the first latch 328, the second latch 330, the third latch 332, the VALMPS delay latch 342, the first delay latch 350, and the second delay latch 352. The third latch 332, the VAIMPS delay latch 342, the first delay latch 350, and the second delay latch 352 are single bit delays. Further, the first latch 328 and the second latch 330 are ctxId register latches of length equal to the ctxId 304 field length. In one embodiment, the latches in the context weight update engine 300 are built with standard flip-flop logic.

In one embodiment, the context weight update engine 300 generates three outputs to be used by other components of the arithmetic coder engine: a weight value 314, a MPS_Flag 336 and an output valid flag 360. These output become valid between the first and the second clock latch edge after the input becomes available at the $0^{th}$ clock edge to the context weight update engine 300. The weight value 314 output, is valid between the first and the second clock latch edge, after the corresponding input, e.g., the acBypass 302, the CtxId 304, the binVal 306, and the Valid 310, which occurred at the $0^{th}$ clock latch edge. The MPS_Flag 336 is valid between the first and the second clock latch edge, after the corresponding input, e.g., the acBypass 302, the CtxId 304, the binVal 306, and the Valid 310, which occurred at the $0^{th}$ clock latch edge. The output valid flag 360 is generated from the first delay latch 350 after the output of the "AND" logic that receives the Valid 310 and the acBypass 302 bit fields.

Single Cycle State Machine Implementation

The two cycle implementation for the context weight update engine 300 processes a new input data set on every other clock cycle. Internally, three clock cycles are utilized to generate the corresponding output. Accordingly, the implementation context weight update engine 300 may have a three clock cycle pipeline delay.

In another embodiment, the context weight update engine 300, which utilizes two clock cycles to access the weight, may be implemented in a single cycle with a pipeline delay as a single cycle context weight update engine 300.

Figure 4:
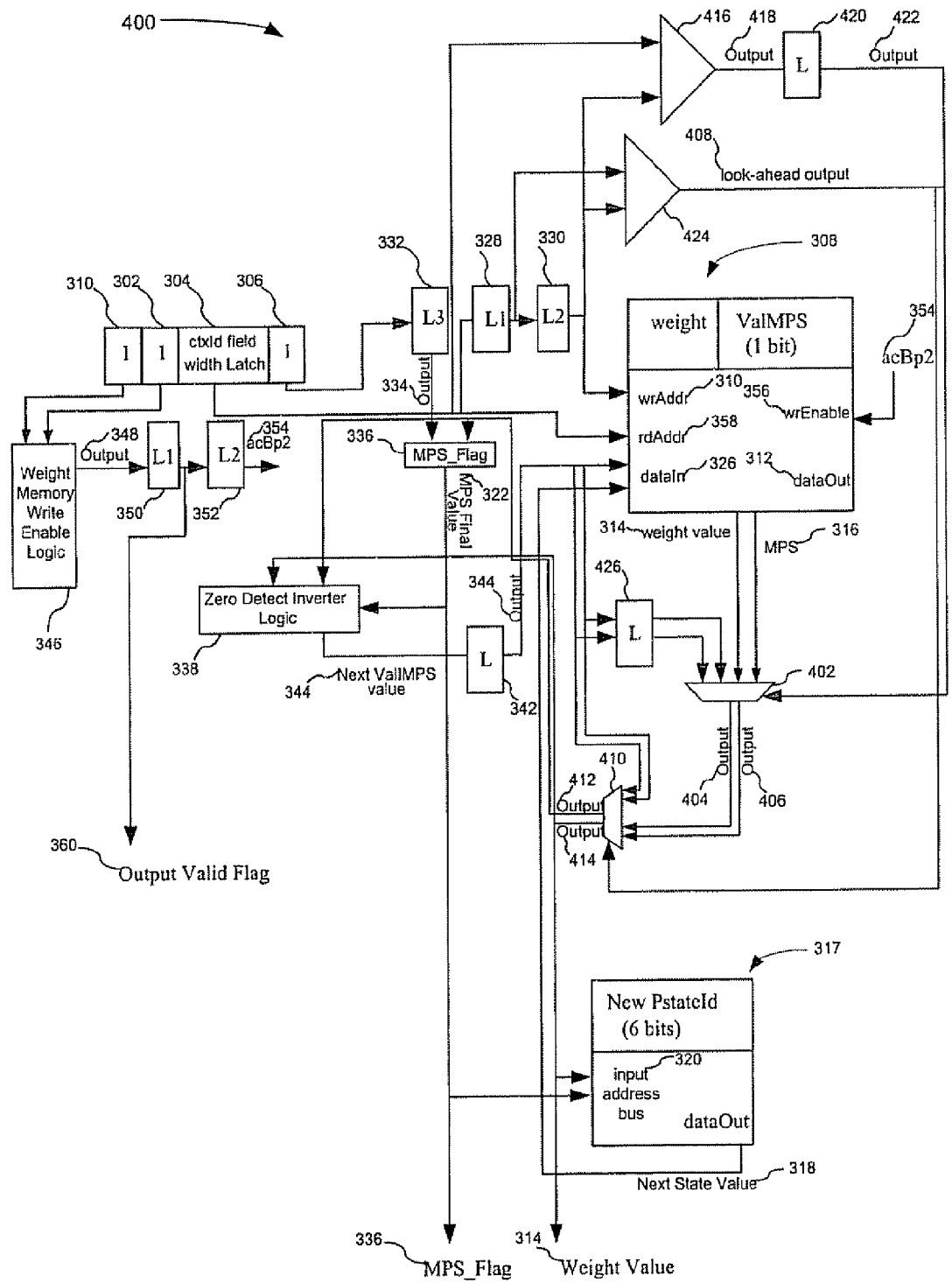
FIG. 4 illustrates a block diagram of the single cycle context weight update engine.

FIG. 4 illustrates a block diagram of the single cycle context weight update engine 400. The single cycle context weight update engine 400 utilizes a look-ahead logic for back-to-back access into the same syntax weight. The single cycle implementation utilizes look-ahead logic to bypass the weight memory, thus reducing the pipeline delay required to store and read the weights and the VALMPS from the weight memory. This look-ahead logic allows the context weight update engine 400 to process a new input data set on every clock cycle.

The single cycle implementation monitors the ctxId values between consecutive input data sets. Under the case when the ctxId values are not the same over consecutives input data sets, the context weight update engine 400 functions in the same manner. In the event that the current input data set has the same ctxId value as the previous data set, then the single cycle context weight update engine 400 forwards the updated weight value from the transition memory output directly to the output while simultaneously storing that value into the weight memory 308. The output of the weight memory 308 is then no longer needed, given that the look-ahead engine has bypassed its use with the transition memory output. In the situation where the ctxId is the same between the current data set and the dataset that is two clock cycles to the past, the weight memory write address will become the same as the read address on the first clock latch edge when the second ctxId dataset is presented as the input. The look-ahead module will force the engine to forward the updated weight value that is clocked into the weight memory for storage as the weight memory output on the next clock period, replacing the weight memory output for the next clock cycle. This look-ahead resolves the need for the weight memory to output the write input data to the output within the same clock cycle if the latched write and read addresses into the weight memory are the same. Furthermore, the look-ahead engine replaces the potentially long delay introduced to the circuitry due to the need to pass the input data through the memory module to the output without any latches in between. The look-ahead module replaces the weight memory read operation with a single latch operation.

In one embodiment, the data inputs, acBypass 302, ctxId 304, binVal 306, and valid field 310, are provided to the context weight update engine 400. On every clock cycle, a new set of input data is clocked into the context weight update engine 300. The context weight update engine 400 will process a new set of input data, consisting of acBypass 302, ctxId 304 and binVal 306, on each clock cycle. In one embodiment, the processing engine will process the inputs, e.g., acBypass 302, ctxId 304 and binVal 306 through six parallel threads, as will be described with reference to FIG. 4.

In a first thread, a new set of input data, e.g., acBypass 302, ctxId 304 and binVal 306 are provided at clock zero. The ctxId 304 is latched into the input address 310 of the weight memory 308 on the first clock cycle. Between the first clock latching edge and the second clock latching edge, the corresponding six bit weight value is available on the output 314 of the weight memory 308. Along with the weight value 314, an MPS 316 is also produced at the output of the weight memory 308. This VALMPS value 316 is also produced between the first and the second clocks latching edge. The weight memory output could be replaced with the latched weight memory input data based on the look-ahead output of the fifth thread, as described below. The replacement operation is carried out by a multiplexer 402. The multiplexer 402 outputs a first output 404 and a second output 406. In another embodiment, the multiplexer 402, the first output 404, and the second output 406 may be replaced by the state transition memory output 318 and the updated VALMPS value based on the look-ahead output 408 of the sixth thread, as described below. The replacement operation is carried out by a multiplexer 410. On the second clock latch edge, the state transition memory 317 will latch a first output 412 and a second output 414 of the multiplexer 410 on the input address bus 320. The state transition memory 317 will also latch the MPS final value 336 produced by the second thread, as described below. The combination of the weight output 314 and the MPS final value 316 constitutes the address input for the state transition table in the state transition memory 317. The state transition memory 317 will output the next state value 318 between the second and third clock latch edge. The output 318 is then fed back to the input data interface 326 of the weight memory 308. This data is then latched on the third clock latch edge into the weight memory 308, completing the update of the weight within the weight memory 308.

In a second thread, the ctxld 304 is delayed by two clock cycles through the first latch 328 and the second latch 330. The ctxld 304 serves as the write address 310 into the weight memory 308 on the third clock latch edge. This corresponds to the data output 318 from the state transition memory 317.

In a third thread, the binVal 306 bit field is delayed by one clock cycle through the third delay latch 332. The one cycle delayed binVal 306 is logically "AND" with the output from the weight memory 308 generated through the first thread. The output of the "AND" logic is labeled the MPS_Flag 336 and is active if the weight memory 308 correctly predicted the binVal 306. The MPS_flag 336, which stabilizes between the first clock and the second clock latch edges, is then fed into the zero detect inverter logic 338, along with the look-ahead output 414, which is provided by the second look-ahead multiplexer 410, and the MPS final bit value 412 from the same second look-ahead multiplexer 410. The zero detect inverter logic 338, which flips the MPS final bit value 412 if the MPS final bit value 412 does not correctly predict the binVal 306, which is reflected by having MPS_Flag 336 equal to zero, and the weight value 314 after the first clock latch edge is equal to zero. The zero detect inverter logic 338 outputs the next VALMPS value 340 between the first and the second clock latch edges. This next VALMPS value 340 is delayed through a VALMPS delay latch 342. The output 344 of the ValMPS delay latch 342 is then fed back to the weight memory 308 as a data input for storage on the third clock latch edge. This completes the update and storage of the MPS for the ctxld 304 latched on the zero clock.

In a fourth thread, the acBypass bit field 302 is inverted and logically "AND" with the valid input bit field 310. The output, weight write enable 348, is delayed by two clock cycles through a first delay latch 350 and a second delay latch 352. The two clock cycle delayed weight write enable 354 is then fed into the write enable input 356 to the weight memory 308. Thus, in the event when acBypass 302 is enabled or the input valid field is not valid, the weight memory 308 will not be updated.

A fifth thread is provided for carrying out the look-ahead function for the case when the ctxld 304 of the current input data set equals the ctxld 304 of the input data set two clock cycles into the past. The ctxld 304 output of the second latch 330 is compared to the input data set ctxld 304. A comparator 416 generates an active high output 418 if the inputs match, where the output 418 comparator 416 is then delayed by one clock cycle through a delay latch 420. The output 422 of the delay latch 420 drives the position of the look-ahead multiplexer 402. The fifth tread contains a single latch and supporting combinatorial logic.

A sixth thread is provided for carrying out the look-ahead function for the case when two consecutive input data sets have the same ctxld 304. The ctxld 304 from the first latch 328 and the second latch 330 are compared. The comparator 424 generates an active output 408 high value if the two inputs match. The output 408 of the comparator 424 drives the position of the look-ahead multiplexer 410. In one embodiment, the sixth thread contains no latches.

In one embodiment, the context weight update engine 400 as described herein includes a number of processing components. The weight memory 308 may be a synchronous dual port memory that supports two memory access interfaces: a read interface and a write interface. The read interface will output through a dedicated output bus the content that is addressed by the latched input address from a dedicated input address interface. The output will become available after the input address clock latch edge, but before the next clock latch edge. The output of this dual port memory is unregistered. The write interface will write the latched data from a dedicated input interface into memory following the address latched on the write address interface. The context weight update engine 300 may support the same clock that clocks both the input and the output latches. In the event that the write address 310 is the same as read address 358, the read data output will reflect the current latched write data input. The context weight update engine 300 may support a write enable input 356, where a write into memory will occur only if the write enable input is high at the time the input address and data are latched.

The state transition memory 317 of the context weight update engine 400 is a single port ROM memory that stores the next weight value based on the current weight value and the MPS_Flag result. The context weight update engine 400 outputs the content addressed by the latched input address 320 to a dedicated output interface 318. The output becomes available after the input address clock latch edge, but before the next clock latch edge. In one embodiment, the output of this ROM single port memory 317 may be unregistered.

The zero detect inverter logic 338 receives the weight value 314, a VALMPS bit, which gives the most probable bin value for this weight address, and the MPS_Flag 336, which is active if the VALMPS bit correctly predicted the binVal for the current input. The zero detect inverter logic 338 inverts VALMPS if the current weight value is zero and the MPS_Flag 336 signals a miss on the prediction. In one embodiment, the zero detect inverter logic 338 includes combinatorial logic without any internal latches.

The MPS_Flag logic 336 outputs a bit. If the weight memory 308 successfully predicted the corresponding binVal 306, then the output is high. Otherwise, the output is low. In one embodiment, the logic includes a single exclusing OR gate without any latches.

The weight memory write enable generation logic 346 generates the write enable signal for the weight memory 308. This logic consists of an AND gate and a NOT gate. The logic receives the acBypass 302 and the valid 310 fields from the input and will generate an active high output if the valid 310 is high and the acBypass 302 is low.

In one embodiment, the context weight update engine 400 includes eight single cycle delay latches, e.g., the first latch 328, the second latch 330, the third latch 332, the VALMPS delay latch 342, the first delay latch 350, the second delay latch 352, a delay latch 420, and a data bus latch 426. The third latch 332, the VAlMPS delay latch 342, the first delay latch 350, the second delay latch 352, and the delay latch 420 are single bit delays. Further, the first latch 328 and the second latch 330 are ctxld register latches of length equal to the ctxld 304 field length. In one embodiment, the latches in the context weight update engine 400 are built with standard flip-flop logic.

In one embodiment, the context weight update engine 400 utilizes two dual-port multiplexers, e.g., the multiplexer 402 and the multiplexer 410, with an input data bus equal to ctxld 304 data width plus one to support the VALMPS field. The multiplexer 402 and the multiplexer 410 may include combinational logic without any latches.

In another embodiment, the context weight update engine 400 includes two dual-port comparators with input data bus width equal to the ctxld 304 data width. The comparators may include combinational logic without any latches.

In another embodiment, the context weight update engine 400 generates three outputs to be used by other components of the arithmetic coder engine: a weight value 314, a MPS_Flag 336 and an output valid flag 360. The output becomes valid between the first and the second clock latch edge after the input becomes available at the zero clock edge to the processing engine. The weight value 314 is valid between the first and the second clock latch edge, after the corresponding input, e.g., the acBypass 302, the Ctxld 304, the binVal 306, and the Valid 310, which occurred at the zero clock latch edge. The MPS_Flag 336 is valid between the first and the second clock latch edge, after the corresponding input, e.g., the acBypass 302, the Ctxld 304, the binVal 306, and the Valid 310, which occurred at the zero clock latch edge. The output valid flag 360 is generated from the first delay latch 350 after the "AND" logic that receives the valid 310 and the acBypass 302 bit fields.

Figure 5:
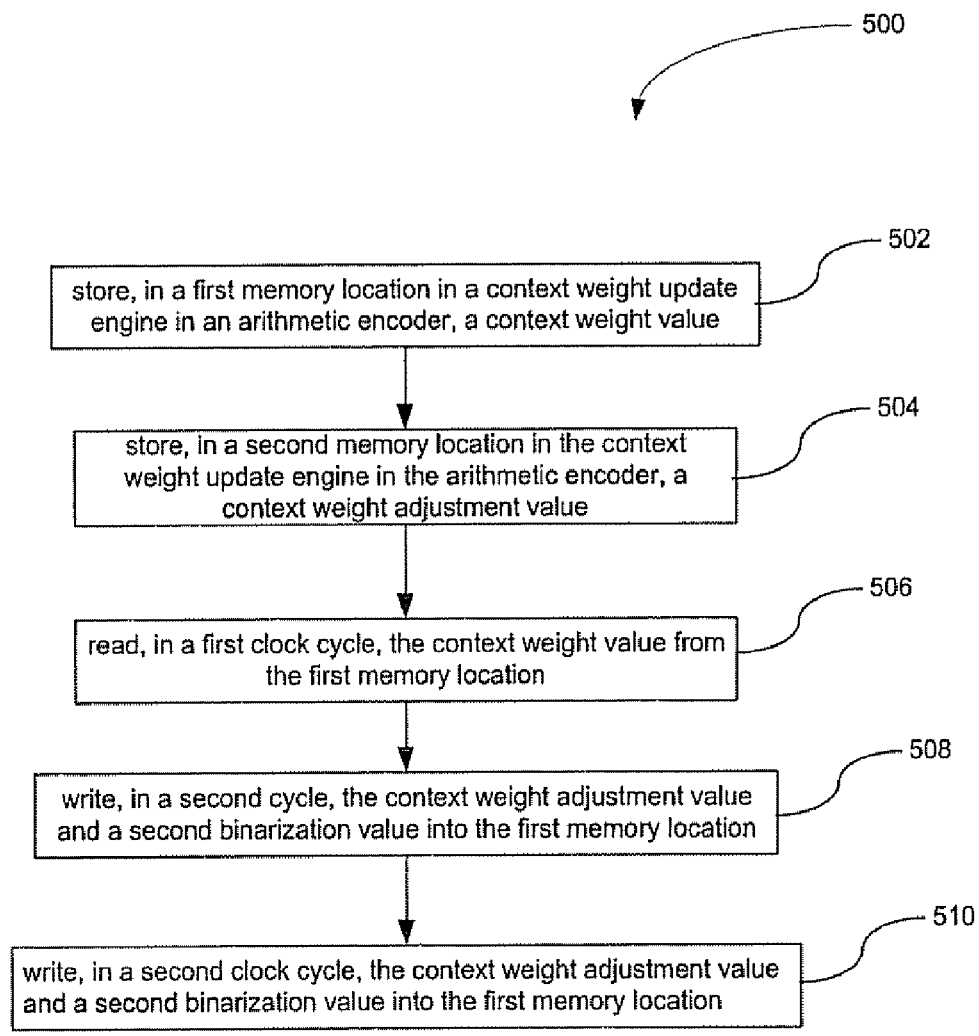
FIG. 5 illustrates a process for the context weight update.

FIG. 5 illustrates a process 500 for the context weight update. At a process block 502, the process stores, in a first memory location in a context weight update engine in an arithmetic encoder, a context weight value. At a next process block 504, the process 500 stores, in a second memory location in the context weight update engine in the arithmetic encoder, a context weight adjustment value. Further, at a next process block 506, the process 500 reads, in a first clock cycle, the context weight value from the first memory location. In addition, at a next process block 508, the process 500 writes, in a second cycle, the context weight adjustment value and a second binarization value into the first memory location. At a process block 510, the process 500 also writes, in a second clock cycle, the context weight adjustment value and a second binarization value into the first memory location. The second binarization value is distinct from the first binarization value.

In one embodiment, a context weight update module, a code range update module, a codelow update module, and a bit count tracking module may be utilized. The context weight update module supports two memory blocks, one to hold the current weight, and the other to hold the weight adjustment value. The context weight update module takes one cycle to read the current context weight, which is then used by the rest of the modules. The second cycle writes the adjusted data back into the memory block. The internal memory block may support simultaneous read/write capability. Thus, the write back cycle includes the read for the next bin. This implementation will function correctly under repeated back-to-back access of the same context weight. This is achieved by configuring the internal memory block with write through capability. The code range module adjusts the code range based on the resulting context weight of the current bin. The new codeRange value is then used to update the codeLow value within the codeLow module. Both the codeRange and the codeLow modules leverage flash shifters to normalize their parameter over a single clock cycle. This normalization process also determines the output bit count, which is also computed within the same cycle. The leading zero detect, which is used to determine the shift size and output bit count, requires special attention to insure single cycle results.

Figure 6:
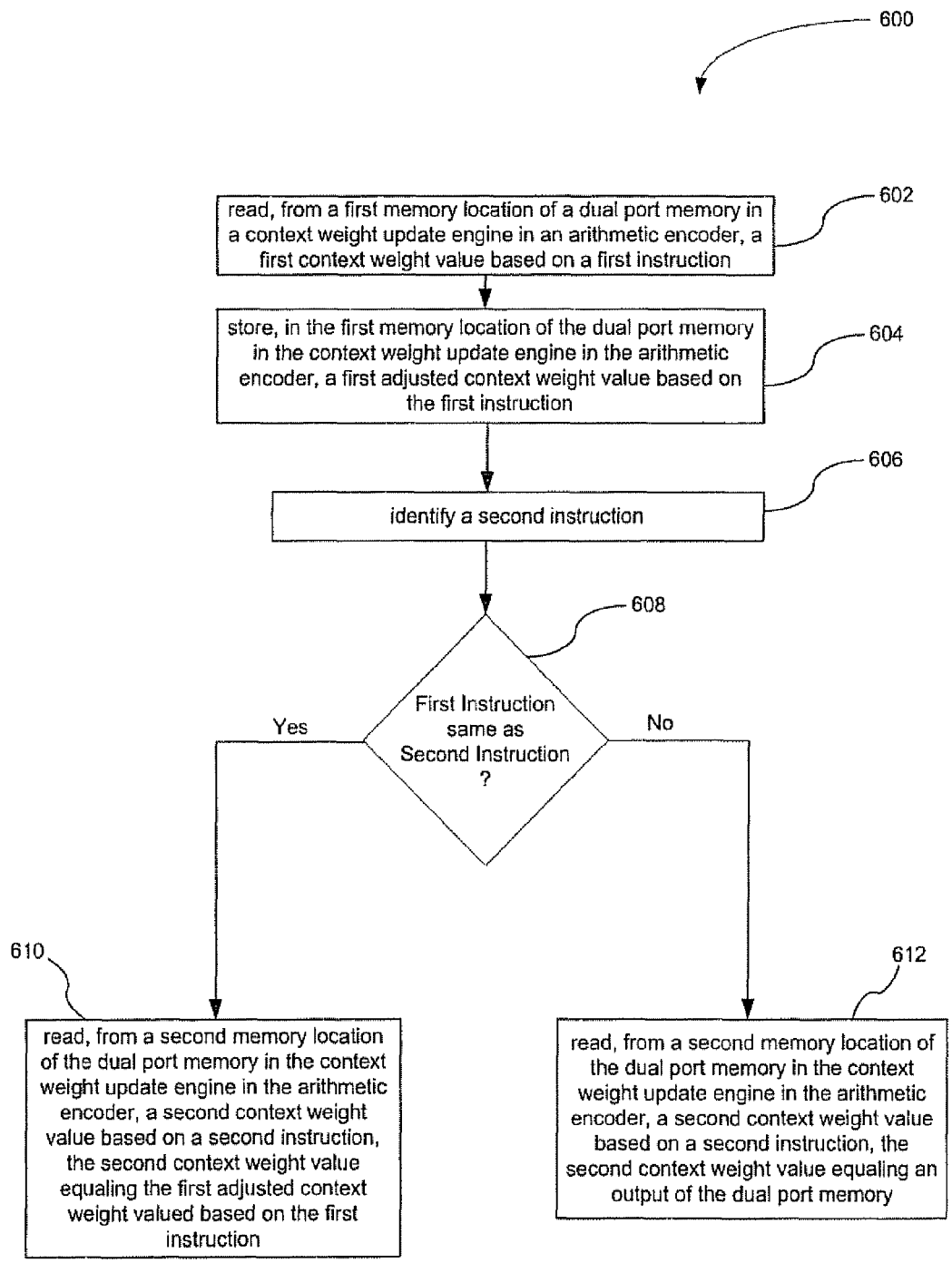
FIG. 6 illustrates another process for the context weight update.

FIG. 6 illustrates another process 600 for context weight update. At a process block 602, the process 600 reads, from a first memory location of a dual port memory in a context weight update engine in an arithmetic encoder, a first context weight value based on a first instruction. Further, at a process block 604, the process 600 stores, in the first memory location of the dual port memory in the context weight update engine in the arithmetic encoder, a first adjusted context weight value based on the first instruction. In addition, at a process block 606, the process 600 identifies a second instruction. At a decision block 608, the process 600 determines if the first instruction is the same as the second instruction. If the process 600 determines, at the decision block 608, that the first instruction is the same as the second instruction, the process block 600 proceeds to a process block 610. At the process block 610, the process reads from a second memory location of the dual port memory in the context weight update engine in the arithmetic encoder, a second context weight value based on a second instruction. The second context weight value equals the first adjusted context weight valued based on the first instruction. If the process 600 determines, at the decision block 608, that the first instruction is distinct from the second instruction, the process 600 proceeds to a process block 612. At the process block 612, the process 600 reads from the second memory location of the dual port memory in the context weight update engine in the arithmetic encoder, the second context weight value based on the second instruction. The second context weight value equals an output of the dual port memory.

Figure 7:
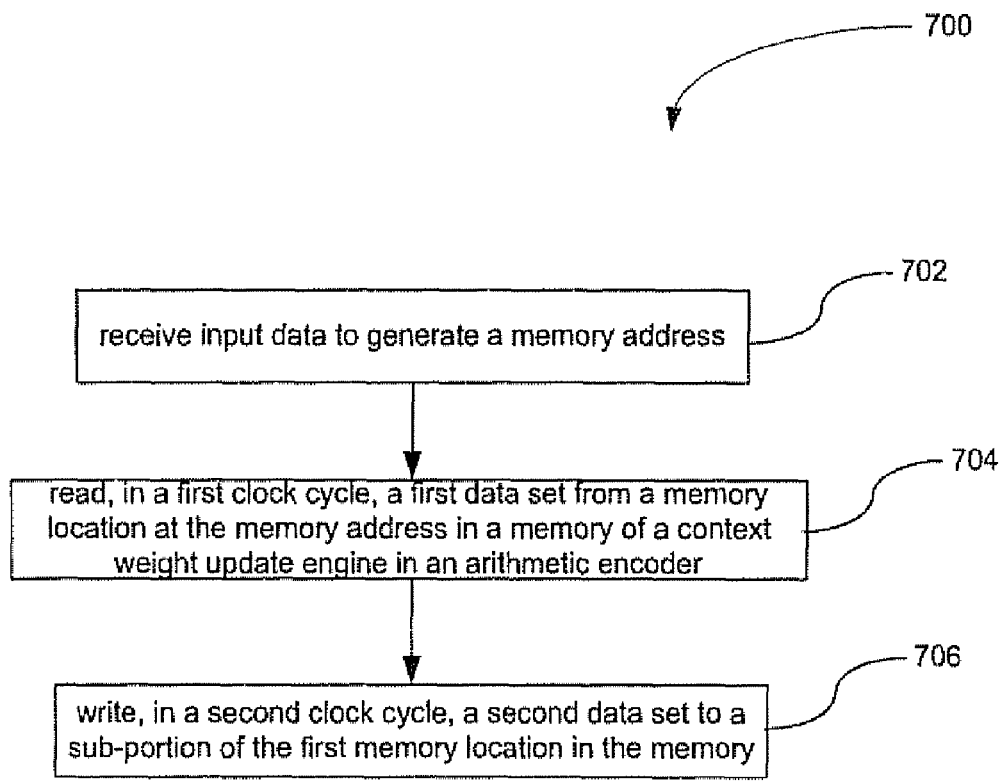
FIG. 7 illustrates another process for the context weight update.

FIG. 7 illustrates another process 700 for context weight update. At a process block 702, the process 700 receives input data to generate a memory address. Further, at a process block 704, the process 700 reads, in a first clock cycle, a first data set from a memory location at the memory address in a memory of a context weight update engine in an arithmetic encoder. In addition, at a process block 706, the process 700 writes, in a second clock cycle, a second data set to a sub-portion of the first memory location in the memory.

Figure 8:
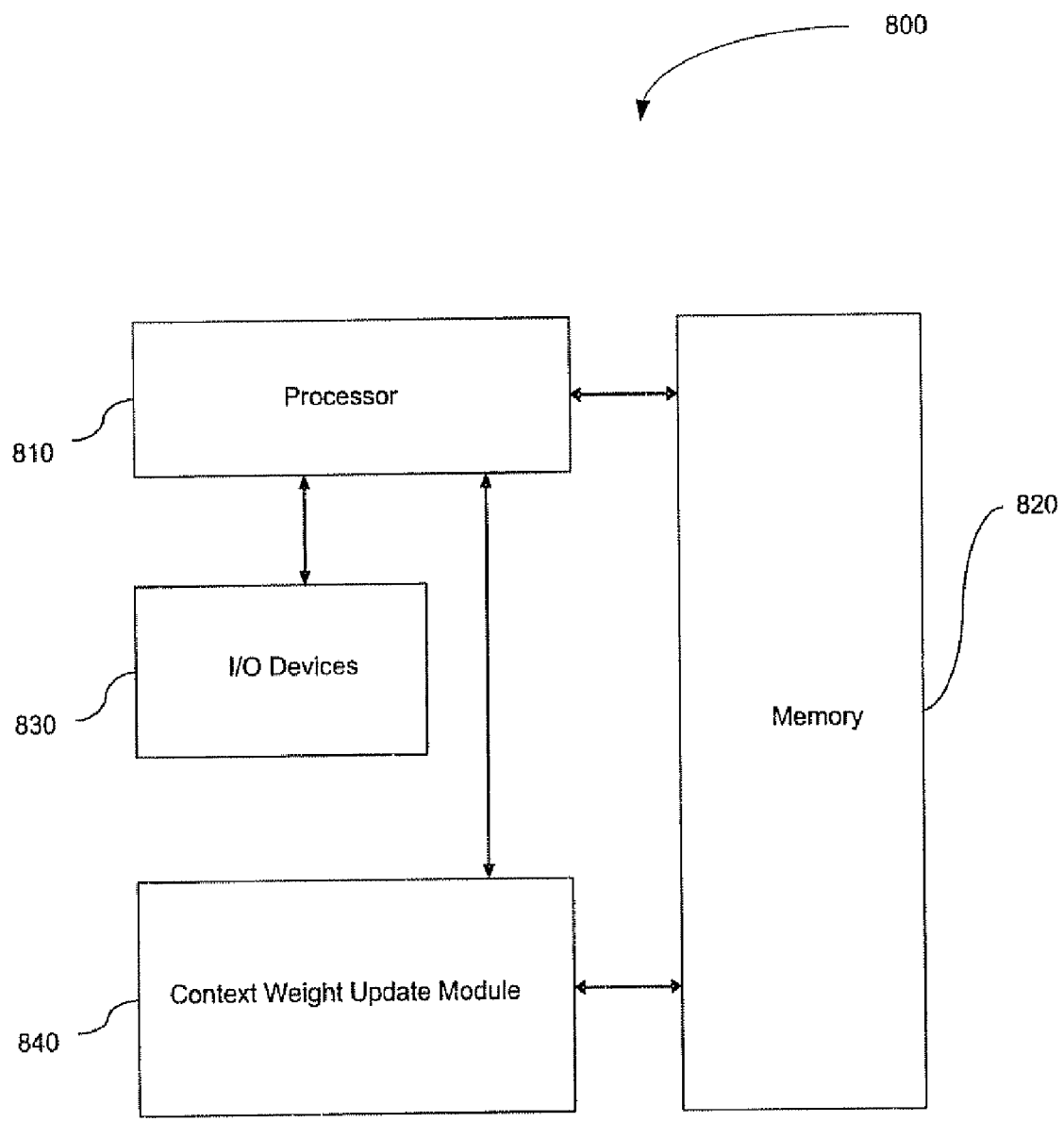
FIG. 8 illustrates a block diagram of a station or system that attempts to implement a context weight update.

FIG. 8 illustrates a block diagram of a station or system 800 that attempts to implement a context weight update. In one embodiment, the station or system 800 is implemented using a general purpose computer or any other hardware equivalents. Thus, the station or system 800 comprises a processor ("CPU") 810, a memory 820, e.g., random access memory ("RAM") and/or read only memory (ROM), a context weight update module 840, and various input/output devices 130, (e.g., storage devices, including but not limited to, a tape drive, a floppy drive, a hard disk drive or a compact disk drive, a receiver, a transmitter, a speaker, a display, an image capturing sensor, e.g., those used in a digital still camera or digital video camera, a clock, an output port, a user input device (such as a keyboard, a keypad, a mouse, and the like, or a microphone for capturing speech commands)).

It should be understood that the context weight update module 840 may be implemented as one or more physical devices that are coupled to the CPU 810 through a communication channel. Alternatively, the context weight update module 840 may be represented by one or more software applications (or even a combination of software and hardware, e.g., using application specific integrated circuits (ASIC)), where the software is loaded from a storage medium, (e.g., a magnetic or optical drive or diskette) and operated by the CPU in the memory 840 of the computer. As such, the context weight update module 840 (including associated data structures) of the present invention may be stored on a computer readable medium, e.g., RAM memory, magnetic or optical drive or diskette and the like.

It is understood that the context weight update engine described herein may also be applied in other type of encoders. Those skilled in the art will appreciate that the various adaptations and modifications of the embodiments of this method and apparatus may be configured without departing from the scope and spirit of the present method and system. Therefore, it is to be understood that, within the scope of the appended claims, the present method and apparatus may be practiced other than as specifically described herein.

I claim:

1. A method comprising:
   storing, in a first memory location in a context weight update engine in an arithmetic encoder, a context weight value;
   storing, in a second memory location in the context weight update engine in the arithmetic encoder, a context weight adjustment value;
   reading, in a first clock cycle, the context weight value and a first binarization value from the first memory location; and
   writing, in a second clock cycle, the context weight adjustment value and a second binarization value into the first memory location, the second binarization value being distinct from the first binarization value.

2. The method of claim 1, wherein the context weight adjustment value is determined by processing the first binarization value, the second binarization value, and the context weight value.

3. The method of claim 1, further comprising adjusting a code range value based on the context weight value.

4. The method of claim 3, further comprising updating a code low value based on the code range value.

5. The method of claim 4, further comprising utilizing a flash shifter to normalize the code range value and the code low value over a clock cycle.

6. The method of claim 5, further comprising determining an output bit count within the clock cycle.

7. The method of claim 1, wherein the first memory location is located in a first memory with a read port and a write port.

8. The method of claim 1, wherein the second memory location is located in a second memory that is a read only memory.

9. The method of claim 1, further comprising, storing the first binarization value in the same memory address location of the first memory in which the context weight value is stored.

10. The method of claim 1, further comprising receiving a context address identification that indicates an address of the first memory location.

11. A method comprising:
    reading, from a first memory location of a dual port memory in a context weight update engine in an arithmetic encoder, a first context weight value based on a first instruction;
    storing, in the first memory location of the dual port memory in the context weight update engine in the arithmetic encoder, a first adjusted context weight value based on the first instruction;
    identifying a second instruction;
    determining if the first instruction is the same as the second instruction;
    if the first instruction is the same as the second instruction, reading from a second memory location of the dual port memory in the context weight update engine in the arithmetic encoder, a second context weight value based on a second instruction, the second context weight value equaling the first adjusted context weight valued based on the first instruction; and
    if the first instruction is distinct from the second instruction, reading from the second memory location of the dual port memory in the context weight update engine in the arithmetic encoder, the second context weight value based on the second instruction, the second context weight value equaling an output of the dual port memory.

12. The method of claim 11, further comprising storing in the second memory location of the dual port memory in the context weight update engine in the arithmetic encoder, a second adjusted context weight value based on the second instruction.

13. The method of claim 11, further comprising identifying a third instruction to write a third data set to a third memory location and determining if the third instruction is the same as the first instruction.

14. The method of claim 13, further comprising, if the first instruction is the same as the third instruction, reading from a third memory location of the dual port memory in the context weight update engine in the arithmetic encoder, a third context weight value based on the third instruction, the third context weight value equaling the first adjusted context weight valued based on the first instruction.

15. The method of claim 13, further comprising, if the first instruction is distinct from the third instruction, reading from the third memory location of the dual port memory in the context weight update engine in the arithmetic encoder, a third context weight value based on the third instruction, the third context weight value equaling an output of the dual port memory.

16. The method of claim 11, wherein the reading based on the second instruction is executed consecutively after reading based on the first instruction.

17. The method of claim 14, wherein the storing based on the first instruction is executed consecutively after the reading based on the second instruction.

18. The method of claim 11, further comprising of sending the first context weight value to an adjusted weight read only memory which utilizes the first context weight value as a memory address to retrieve the first adjusted context weight value and receives the first adjusted context weight value from the adjusted weight read only memory.

19. A method comprising:
    receiving input data to generate a memory address;
    reading, in a first clock cycle, a first data set from a memory location at the memory address in a memory of a context weight update engine in an arithmetic encoder; and
    writing, in a second clock cycle, a second data set to a sub-portion of the first memory location in the memory.

20. The method of claim 19, further comprising providing a first subset of the first data set read from the memory to a zero output detector and comparing output from the zero output detector to a second subset of the first data set read from the memory, and storing a result of the comparison into an additional sub-portion of the memory.

* * * * *